(12) United States Patent
Graef et al.

(10) Patent No.: US 7,971,125 B2
(45) Date of Patent: Jun. 28, 2011

(54) SYSTEMS AND METHODS FOR PRIORITIZING ERROR CORRECTION DATA

(75) Inventors: Nils Graef, Santa Clara, CA (US); Erich F. Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 1207 days.

(21) Appl. No.: 11/620,988

(22) Filed: Jan. 8, 2007

(65) Prior Publication Data

US 2008/0168330 A1 Jul. 10, 2008

(51) Int. Cl.
*G11B 20/18* (2006.01)
*H03M 13/45* (2006.01)

(52) U.S. Cl. .................. 714/769; 714/780; 714/784

(58) Field of Classification Search .................. 714/755, 714/780, 784, 769
See application file for complete search history.

(56) References Cited

U.S. PATENT DOCUMENTS

| | | | |
|---|---|---|---|
| 5,278,846 A | 1/1994 | Okayama et al. | |
| 5,325,402 A | 6/1994 | Ushirokawa | |
| 5,392,299 A | 2/1995 | Rhines et al. | |
| 5,513,192 A | 4/1996 | Janku et al. | |
| 5,612,964 A | 3/1997 | Haraszti | |
| 5,701,314 A | 12/1997 | Armstrong et al. | |
| 5,712,861 A * | 1/1998 | Inoue et al. | 714/752 |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |

(Continued)

FOREIGN PATENT DOCUMENTS

WO WO 2006/016751 2/2006

(Continued)

OTHER PUBLICATIONS

Reggiani et al., "On Reverse Concatenation and Soft Decoding Algorithms for PRML Magnetic Recording Channels", IEEE Journal on Selected Areas in Communications, vol. 19, No. 4, Apr. 2001, pp. 612-618.*

(Continued)

*Primary Examiner* — Stephen M Baker
(74) *Attorney, Agent, or Firm* — Hamilton, DeSanctis & Cha

(57) ABSTRACT

Various systems and methods for generating and/or ordering error indications are disclosed herein. In some cases, the error indication is used as an erasure pointer in a memory access system. As one particular example, a system for ordering erasure pointers is disclosed that includes a group of N sort cells, where N is a whole number. Each of the sort cells is operable to maintain a respective error indication that includes an error value and an associated error pointer. Further, the group of N sort cells is operable to receive an incoming error indication including error value and associated error pointer, and to update the error indication of one or more of the group of N sort cells based in part on the incoming error value. The system also includes a selector circuit that is operable to allow selectable access to each of the respective error pointers maintained in the group of N sort cells.

33 Claims, 9 Drawing Sheets

U.S. PATENT DOCUMENTS

| | | | |
|---|---|---|---|
| 6,065,149 A * | 5/2000 | Yamanaka | 714/780 |
| 6,097,764 A | 8/2000 | McCallister et al. | |
| 6,145,110 A * | 11/2000 | Khayrallah | 714/752 |
| 6,216,251 B1 | 4/2001 | McGinn | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 * | 4/2002 | Weng | 714/780 |
| 6,438,717 B1 | 8/2002 | Butler et al. | |
| 6,473,878 B1 | 10/2002 | Wei | |
| 6,511,280 B1 * | 1/2003 | Sammartino et al. | 414/784 |
| 6,625,775 B1 | 9/2003 | Kim | |
| 6,671,404 B1 | 12/2003 | Kawatani et al. | |
| 6,748,034 B2 | 6/2004 | Hattori et al. | |
| 6,757,862 B1 | 6/2004 | Marianetti | |
| 6,788,654 B1 | 9/2004 | Hashimoto et al. | |
| 6,810,502 B2 | 10/2004 | Eidson | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,093,179 B2 | 8/2006 | Shea | |
| 7,184,486 B1 | 2/2007 | Wu et al. | |
| 7,191,378 B2 | 3/2007 | Eroz et al. | |
| 7,203,887 B2 | 4/2007 | Eroz et al. | |
| 7,257,764 B2 | 8/2007 | Suzuki et al. | |
| 7,310,768 B2 | 12/2007 | Eidson et al. | |
| 7,370,258 B2 * | 5/2008 | Iancu et al. | 714/755 |
| 7,587,657 B2 * | 9/2009 | Haratsch | 714/780 |
| 2004/0098659 A1 | 5/2004 | Bjerke et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0248435 A1 | 11/2006 | Haratsch | |
| 2007/0047635 A1 | 3/2007 | Stojanovic et al. | |
| 2007/0286270 A1 | 12/2007 | Huang et al. | |
| 2008/0049825 A1 | 2/2008 | Chen et al. | |
| 2008/0168330 A1 | 7/2008 | Graef et al. | |

FOREIGN PATENT DOCUMENTS

| | | |
|---|---|---|
| WO | WO 2006/091797 | 8/2007 |

OTHER PUBLICATIONS

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR PRIORITIZING ERROR CORRECTION DATA

BACKGROUND OF THE INVENTION

The present invention is related to systems and methods for accessing a storage medium, and more particularly to systems and methods for generating erasure flags in relation to storage media access.

Various errors can occur when accessing information from a storage medium. To compensate, one or more encoding/decoding schemes are utilized that allow for error correction of the information accessed from the storage medium. For example, various hard disk drives utilize a Reed Solomon decoder to detect and correct errors in a received data stream. However, where too many errors exist in the data stream a Reed Solomon decoder may not come to a conclusion. To avoid this, one or more systems may indicate an overabundance of errors by setting an erasure flag. Such erasure flags have historically been generated and treated sequentially. However, such an approach may result in consideration of relatively inconsequential errors at the expense of full consideration of errors of greater consequence.

Hence, for at least the aforementioned reasons, there exists a need in the art for advanced systems and methods for generating error indications.

BRIEF SUMMARY OF THE INVENTION

The present invention is related to systems and methods for accessing a storage medium, and more particularly to systems and methods for generating erasure flags in relation to storage media access.

Various embodiments of the present invention provide systems for ordering error indications. Such systems include a group of N sort cells, where N is a whole number. Each of the sort cells is operable to maintain a respective error indication that includes an error value and an associated error pointer. Further, the group of N sort cells is operable to receive an incoming error indication including error value and associated error pointer, and to update the error indication of one or more of the group of N sort cells based in part on the incoming error value. The system also includes a selector circuit that is operable to allow selectable access to each of the respective error pointers maintained in the group of N sort cells.

In some cases of the aforementioned embodiments, each of the N sort cells includes a comparator that is operable to compare the incoming error value with the error value held in the respective sort cell. In such cases, the N sort cells may also include an update circuit that is operable to update the respective sort cell to include the incoming error value and associated error pointer when the comparison of the incoming error value with the error value held in the respective sort cell indicates that the incoming error value is more significant than the error value held in the respective sort cell.

In various cases of the aforementioned embodiments, the sort cells are ordered such that the error value held in the $N^{th}$ sort cell is less than the error value held in the $(N-1)^{th}$ sort cell, and the error value held in the first sort cell is greater than the error value held in the $(N-1)^{th}$ sort cell. In particular cases of the aforementioned embodiments, the group of N sort cells is operable to disregard the incoming error value and associated error pointer when the incoming error value is less than the error value maintained in the $N^{th}$ sort cell. In some cases of the aforementioned embodiments, the selector circuit is a multiplexer.

Other embodiments of the present invention provide methods for ordering erasure pointers. Such methods include receiving a plurality of error indications that each include an error value and an error pointer. The methods further include ordering the plurality of error indications based on the respective error values, and maintaining the plurality of error indications in a register set. A selector circuit is provided that is operable to provide respective error pointers from the register set based on the ordering of the plurality of error indications. The methods may further include receiving an additional error indication that includes an error value and an error pointer, and comparing the error value associated with the additional error indication with the error values associated with one or more of the plurality of error indications. Where the comparisons indicate that error value associated with the additional error indication is more significant than at least one of the one or more of the plurality of error indications, the plurality of error indications is re-ordered. In other cases, the error value associated with the additional error indication is compared with the least significant error value included in the plurality of error indications, and is determined to be less significant than the least significant error value. In such a case, the additional error indication is disregarded.

Yet other embodiments of the present invention provide systems for generating and ordering error indications. Such systems include an error indication generator and an error prioritizing circuit. The error indication generator provides at least a first error value and an associated first error pointer, and a second error value and an associated second error pointer. The error prioritizing circuit is coupled to the error indication generator, and receives the first and second error values and the associated first and second error pointers. The error prioritizing circuit is further operable to compare the first error value with the second error value, and to maintain a prioritized list including the first error pointer and the second error pointer based on the aforementioned comparison.

In some instances of the aforementioned embodiments, the error indication generator may be a circuit that detects thermal asperities, a sequence detector, or an ADC error detector. Such an ADC error detector may include an analog to digital converter that is operable to receive an analog signal and to produce a series of digital values based on the analog signal, and an error look up table that is operable to receive the series of digital values and to produce a corresponding series of error values.

The aforementioned sequence detector may include a soft output viterbi decoder that is operable to receive a data stream and to produce a series of reliability indicators based on an incoming data stream, and to provide a bit decision in relation to each of the respective reliability indicators. The sequence detector may further include a reliability threshold register providing a reliability threshold output, and a comparator that compares the reliability threshold output with each of the respective reliability indicators, and an accumulator that accumulates the sum of the outputs from the comparator. In one particular instance, the accumulator provides a symbol error value that is associated with a group of consecutive reliability outputs from the sequence detector (e.g. each symbol error values corresponds to a group of 10 consecutive reliability values).

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for accessing a storage medium, and more particularly to systems and methods for generating erasure flags in relation to storage media access.

The bit error rate performance of a hard disk drive system can be improved by error erasure decoding using an error correction coding controller that uses erasure pointers. Such erasure pointers are usually generated on a symbol by symbol basis. In some cases, the error erasure pointers may be generated based on thermal asperity events or modulation code violations. In some cases, a read channel receiving data from a magnetic storage medium flags more symbols with erasure pointers in a given sector than can be properly treated. For example, in the case of a Reed Solomon decoder, a system may only be able to treat twenty erasure pointers over the course of a sector (e.g., a sector may consist of 4096 bytes, i.e. 410×10-bit symbols). Some embodiments of the present invention address this limitation by providing a sorted list of erasure pointers. Such a sorted list may be sorted in order of highest priority errors, thus assuring that in the aforementioned condition that the errors of highest priority are dealt with while those of lower priority may be ignored.

Figure 1A:
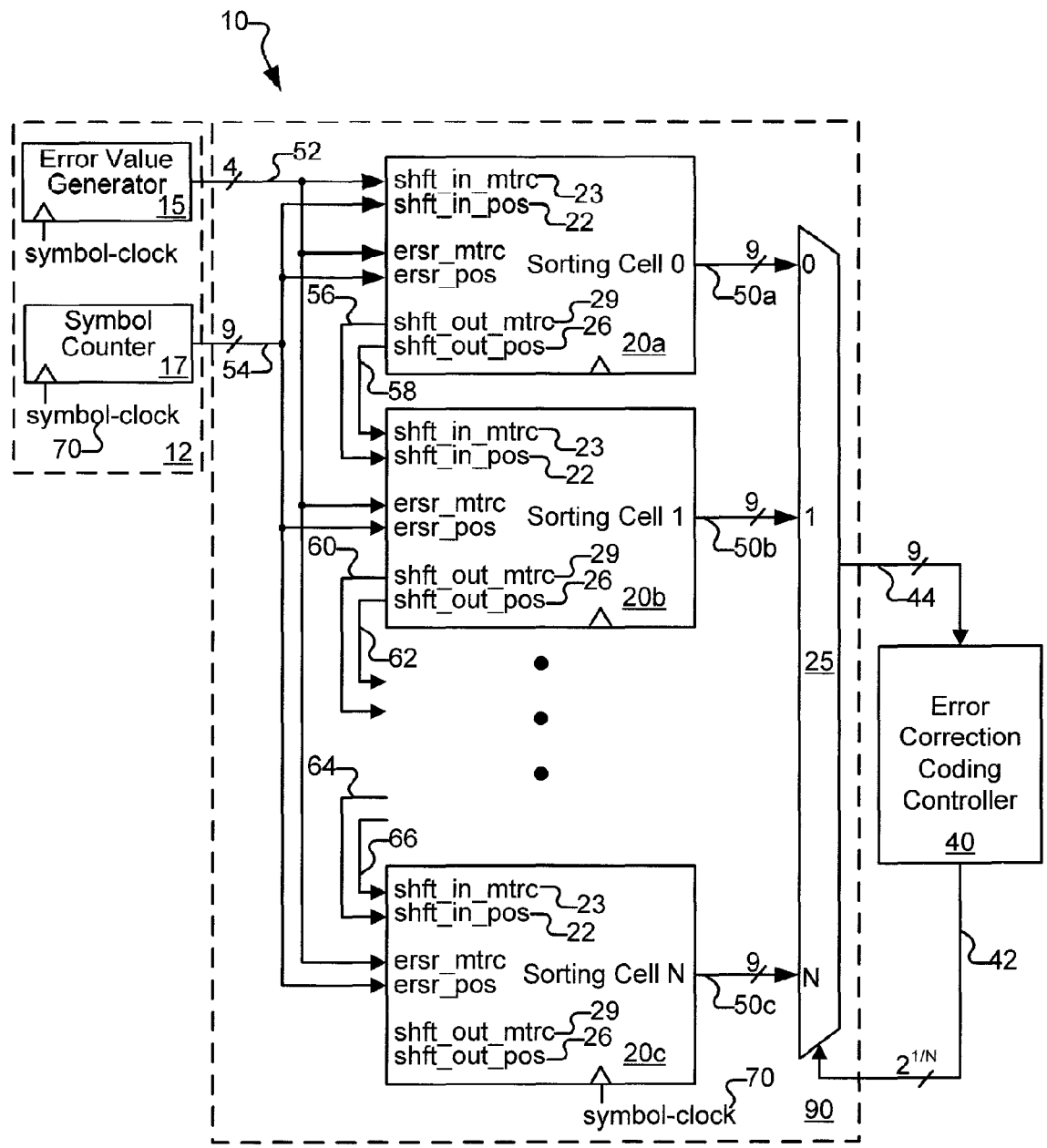
FIGS. 1a-1b are schematic diagrams of an error correction system including an error pointer prioritization system in accordance with one or more embodiments of the present invention.

Turning to FIG. 1, a system 10 for generating and ordering error pointers is depicted in accordance with one or more embodiments of the present invention. System 10 includes an error indication generator 12 that includes an error value generator 15 and a symbol counter 17, an error pointer ordering circuit 90, and an error correction coding controller 40. Error value generator 15 provides an error value output 52 indicating the severity of an error associated with an error pointer. Any error value generator capable of providing a severity output may be used. For example, error value generator 15 may be an erasure pointer circuit as is known in the art that detects thermal asperities. As another example, error value generator 15 may be a soft output of a viterbi detector or other type of sequence detector as discussed below may be utilized. As yet another example, an ADC error detector as discussed below may be utilized. Based on the disclosure provided herein, one of ordinary skill in the art will recognize a variety of error value generators that may be used in accordance with one or more embodiments of the present invention.

Symbol counter 17 provides a value (i.e., error pointer input 54) that is indicative of a position associated with the output of error value generator 15 (i.e., error value output 52). Error value generator 15 may be, but is not limited to, a soft output Viterbi detector or decoder, or a soft output maximum-a-posteriori (MAP) detector or decoder. Symbol counter 17 may be any device or circuit capable of providing location information associated with a generated error value. In one particular embodiment of the present invention, symbol counter is simply a counter that is incremented as each symbol is presented to error value generator 15. Both error value generator 15 and symbol counter 17 are synchronized by a symbol clock 70. Together, error pointer input 54 and error value output 52 are considered an error indication (i.e., the combination of an error value and pointer indicating an actual or relative location of the error value).

Error pointer ordering circuit 90 includes a number of sorting cells 20 that are each capable of maintaining one error indication received from error value generator 15 and symbol counter 17 via error pointer input 54 and error value output 52. In the depicted embodiment, error value output 52 is a four bit output, and error pointer input 54 is a nine bit output. Based on the disclosure provided herein, one of ordinary skill in the art will recognize other bus sizes that may be used to properly convey error pointer input 54 and error value output 52. The sorting cells are interconnected such that sorting cell 20a always maintains the most severe error pointer information, sorting cell 20b maintains the next most severe error pointer information, and sorting cell 20c maintains the $N^{th}$ most severe error pointer information. Any error pointer information less severe than the $N^{th}$ most severe erasure pointer information is not retained. In particular, a position output 56 (driven by a shift output 29 from sorting cell 20a) and an error pointer output 58 (driven by a shift output 26 from sorting cell 20a) connects sorting cell 20a and sorting cell 20b. A position output 60 (driven by a shift output 29 from sorting cell 20a) and an error pointer output 62 (driven by a shift output 26 from sorting cell 20a) connects sorting cell 20b to the next sorting cell (not shown). A position output 64 (driven by a shift output 29 from a preceding sorting cell (not shown)) and an error pointer output 66 (driven by a shift output 26 from the preceding sorting cell (not shown)) connects sorting cell 20c to the preceding sorting cell (not shown).

Each of the sorting cells drives a respective error pointer output 50 to an N input multiplexer 25. Error pointer output 50 is the information originally received as error pointer input 54 from symbol counter 17. Thus, where error pointer input 54 is a nine bit value, error pointer output 50 will be a nine bit value. Again, based on the disclosure provided herein, one of ordinary skill in the art will recognize other values that may be used as error pointer input 54 in accordance with other embodiments of the present invention. An error correction coding controller 40 provides a selection control output 42 to multiplexer 25 that is operable to select which of the N error pointer outputs 50 is provided to error correction coding controller 40. It should be noted that multiplexer 25 may be replaced by a serial read circuit (not shown) that is operable to sequentially read out the N sorting cells. It also should be noted that multiplexer 25 or the alternative serial read circuit are each "selector circuits" as that phrase is used herein. As used herein, the phrase "selector circuit" may be any circuit, including but not limited to the aforementioned, that operates to select a subset of available outputs. Error correction coding controller 40 may be any coding controller known in the art such as, but not limited to, a Reed Solomon Decoder. Based on the disclosure provided herein, one of ordinary skill in the art will recognize other error correction coding controllers that may be used in relation to one or more embodiments of the present invention. N may be determined as the largest number of error pointers (e.g., erasure pointers) that can be properly treated by an error correction coding controller 40.

In operation, data is presented to error value generator 15 on a symbol by symbol basis, and a value of any error(s) detected in the data is generated and provided as error value output 52. Further, each time a symbol of data is presented to error value generator 15, symbol counter 17 is incremented. Thus, symbol counter 17 provides error pointer input 54 that in this case is a relative location of the error value provided by error value generator 15. The value on error value output 52 is compared with each of the error value outputs stored in sorting cells 20. Based on these comparisons, the error values maintained in sorting cells are re-ordered such that the error pointer associated with the most significant error value is stored in sorting cell 20a, the next most significant is stored in sorting cell 20b, and the least significant is stored in sorting cell 20c. In the case where the most recent error value received from error value generator is less significant than the error value maintained in any of sorting cells 20, the most recent error value is disregarded. Alternatively, in the case where the error value is more significant than at least one of the maintained error values, the previously maintained least significant error value is eliminated, and sorting cells 20 are re-ordered based on the order of the respective error values. Thus, for example, where only sorting cell 20a, 20b and 20c are used, they each include an error value with the most significant error value in sorting cell 20a and the least significant error value in sorting cell 20c, and the new error value (i.e., error value output 52) is greater than the error value in sorting cell 20b; then, the error value in sorting cell 20a is maintained, the error value in sorting cell 20b is replaced with the new error value, the error value previously in sorting cell 20b is stored in sorting cell 20c, and the error value previously stored in sorting cell 20c is disregarded.

Figure 1B:
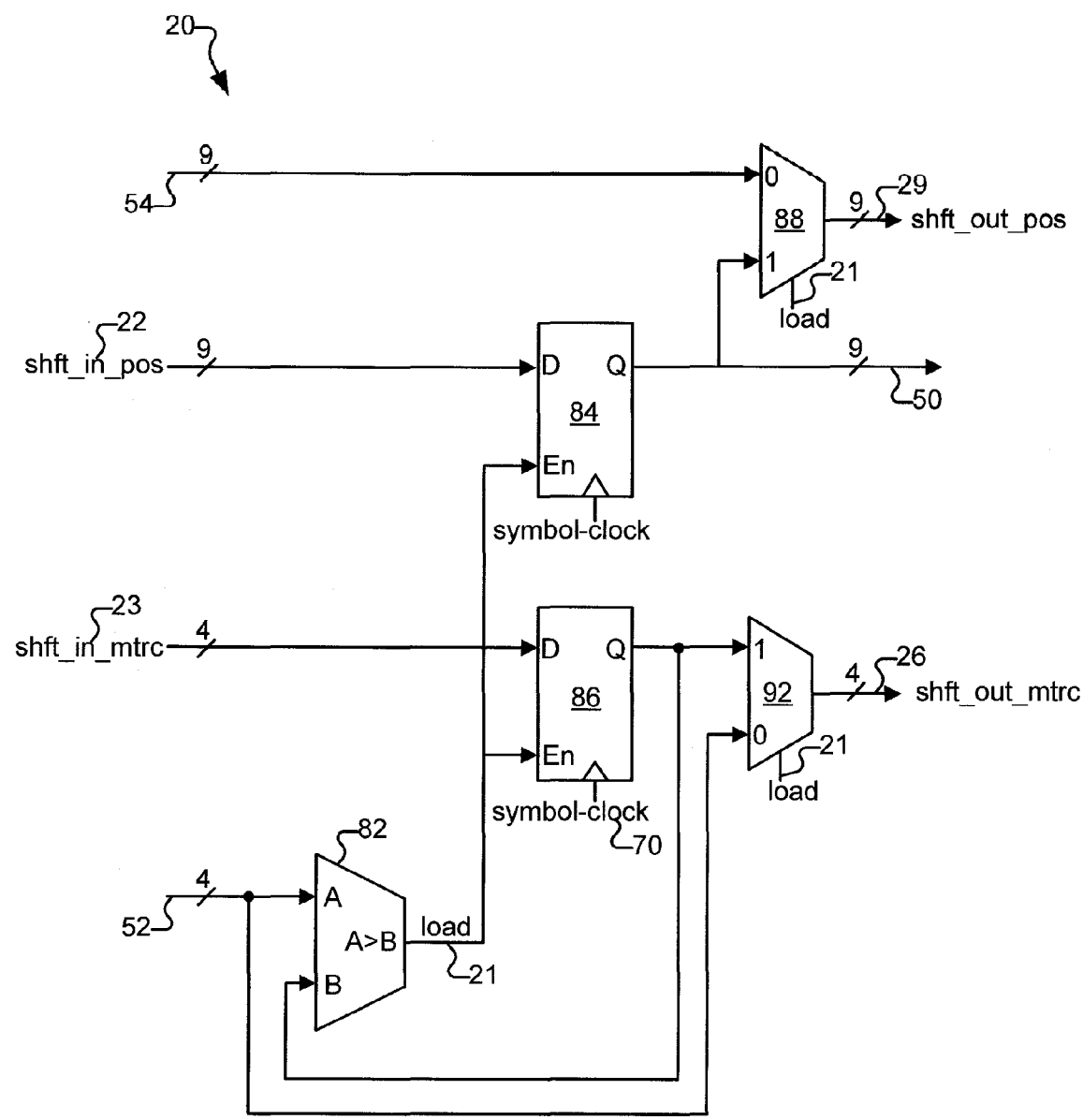

Turning to FIG. 1b, a detailed view of an exemplary sorting cell 20 in accordance with various embodiments of the present invention is depicted. As shown, sorting cell 20 includes a error pointer register 84 and an error value register 86 that are each synchronized to symbol clock 70. The data input to error pointer register 84 is a position input 22, and the data input to error value register 86 is a pointer input 23 (i.e., an error value received either from another sorting cell 20 or by an error value generator as shown above in FIG. 1a). A comparator 82 compares the difference between the most recent error value output 52, and the value currently maintained in error value register 86. Where the value of the most recent error value output 52 is greater than the currently maintained value, then a load enable signal 21 is asserted causing the error pointer and error value provided by the previous sorting cell 20 to be loaded into error pointer register 84 and error value register 86, respectively. Where, on the other hand, the value of the most recent error value output 52 is less than the currently maintained value, then load enable signal 21 is not asserted and the values currently maintained in error pointer register 84 and error value register 86 are maintained.

In addition, where load enable signal 21 is asserted, the value previously stored in error pointer register 84 and error value register 86 are shifted out to the next sort cell as shift out 26 and shift out 29, respectively. Alternatively, where load enable signal 21 is not asserted, the current values of error pointer input 54 and error value output 52 are passed to the next sort cell as shift out 26 and shift out 29, respectively. Error pointer output 50 is always the current value maintained on error pointer register 84. In operation, error value register 86 in all of sorting cells 20 is initially reset. Over the course of processing the data set, sorting cells 20 are loaded with the incoming error indications, and the incoming error indications are maintained in sorting cells 20 in an order from most significant to least. Thus, the registers of sorting cells 20 implement a list of the N error pointers associated with the worst N error values, where each line of the list is represented by one individual sorting cell 20.

Figure 2:
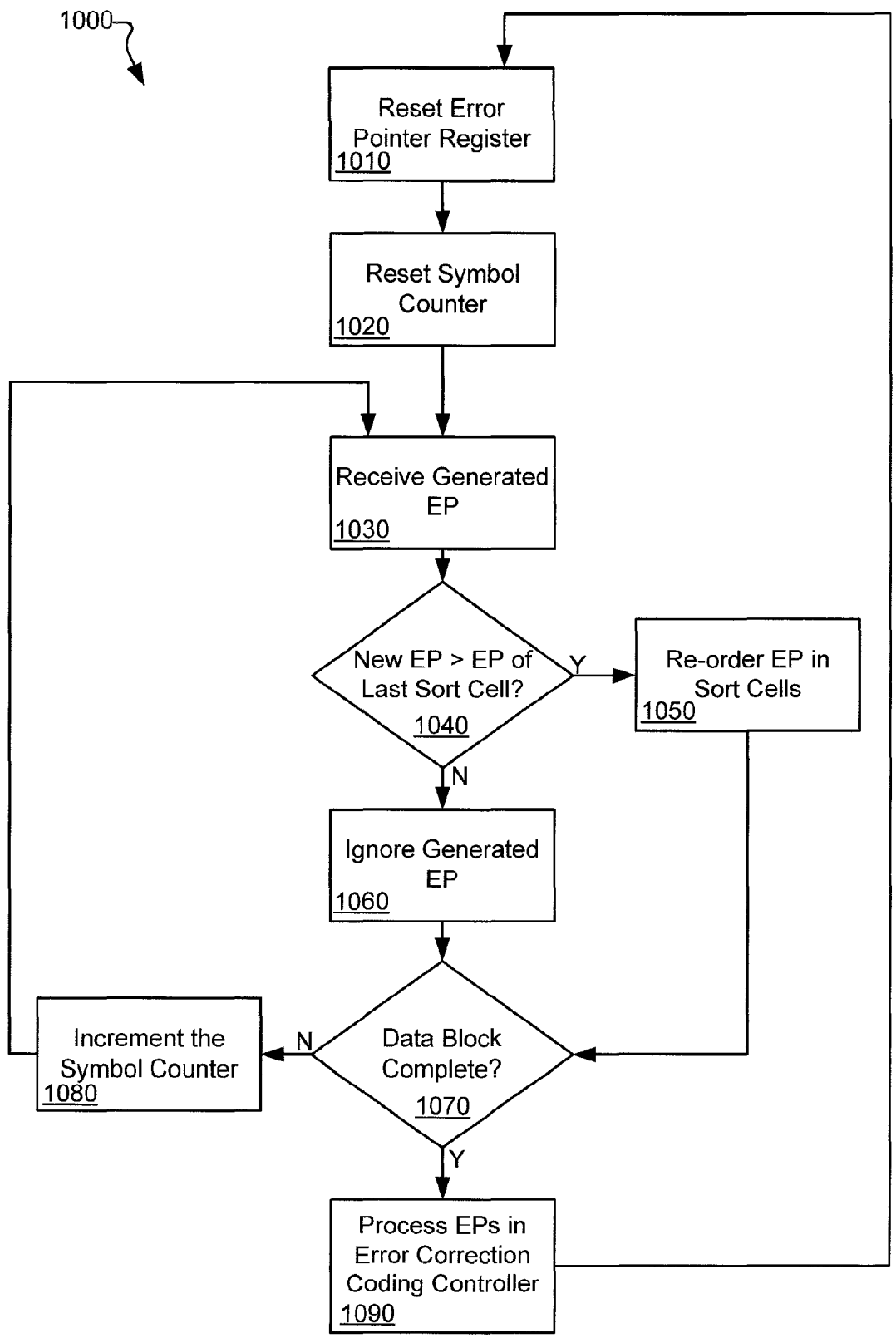
FIG. 2 is a flow diagram depicting a method in accordance with some embodiments of the present invention for prioritizing error pointers.

Turning to FIG. 2, a flow diagram 1000 depicts a method in accordance with some embodiments of the present invention for prioritizing error pointers. Following flow diagram 1000, registers previously maintaining error pointers and associated error values are reset along with a symbol counter (blocks 1010, 1020). A new error pointer and error value is generated and provided to a sorting system (block 1030). The error value associated with the new error pointer is compared with one or more previously stored error values to determine whether it is greater than the smallest of the previously stored error values (block 1040). It should be noted that as used herein, the term "greater" or "more than" is used in its broadest sense to mean any concept of heightened significance. Thus, a first error value may be greater than a second error value where the magnitude of the first error value indicates a more significant error than that indicated by the magnitude of the second error value. Where the newly received error value is greater than at least the smallest of the previously stored error values (block 1040), then the group of error pointers is reordered so that the newest error pointer and associated error value is included in the priority list and the error pointer associated with the smallest of the previously stored error values is eliminated from the list (block 1050). Alternatively, where the newly received error value is less than the smallest of the previously stored error values (block 1040), then the group of error pointers is maintained as is (block 1060). Similar to the discussion above regarding the term greater, as used herein, the term "smaller" or "less than" is used in its broadest sense to mean any concept of lower significance. Thus, a first error value may be less than a second error value where the magnitude of the first error value indicates an error of lower consequence than that indicated by the magnitude of the second error value.

It is determined whether an entire block of data has been processed (block 1070) (i.e., it is determined whether any more error pointers are expected). Where more error pointers are expected (block 1070), the symbol counter is updated to reflect the position of the next error pointer (block 1080). After this, the processes of blocks 1030-1070 are repeated for the next error pointer. Alternatively, where the block has been completed (block 1070), the maintained error pointers are processed using an error correction coding controller 1090, and the processes of blocks 1010-1090 are repeated for the error pointers from the next block of data. In some cases, the error pointer may be erasure pointers as are commonly used in hard disk drive applications.

It should be noted that various embodiments of the present invention provide for receiving error values from an error value generator, and prioritizing the received error values and corresponding error pointers. Such error value generators may be, but are not limited to, soft output Viterbi decoders or detectors, or MAP decoders or detectors. Two other possible error generators are discussed below in relation to FIG. 3 and FIG. 6. One of ordinary skill in the art will recognize that embodiments of the present invention are capable of receiving error values and pointers from a number of different types of error value generators as are known in the art.

Figure 3:
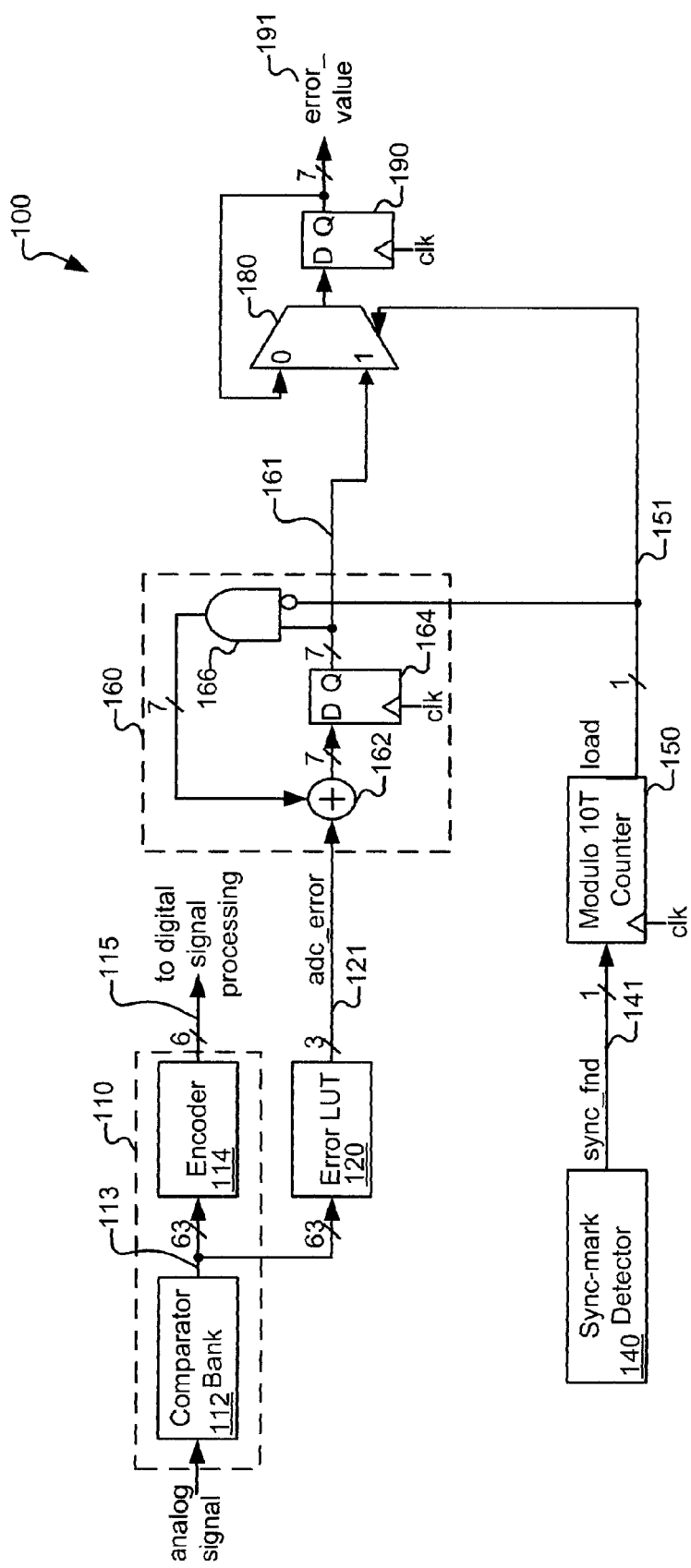
FIG. 3 is a schematic diagram of a circuit for generating error values based on analog to digital conversion error detection.

Turning to FIG. 3, an exemplary erasure value generating circuit 100 is depicted. Erasure value generating circuit 100 includes an analog to digital converter 110 that is comprised of a comparator bank 112 and an encoder 114. An output 113 of comparator bank 112 provides a series of digital values that are fed to both encoder 114 and an error look up table 120. In turn, encoder 114 encodes the series of digital values as an output 115. Output 115 is provided to one or more digital signal processing circuits (not shown). For example, erasure value generating circuit 100 may be included as part of a decoder included in a hard disk drive system. In such a case, output 115 may be provided to one or more soft output viterbi algorithm decoders and/or Reed Solomon decoders that operate to recover data from an analog data stream retrieved from the magnetic storage media of the hard disk drive.

Under perfect conditions, comparator bank 112 generates an error free output pattern as output 113. In one particular case, comparator bank 112 provides a thermometer code output. As used herein, the phrases thermometer code is used in its broadest sense to mean a code whereby each incrementally larger code value is indicated by setting or unsetting the next bit in the output symbol. Thus, for example, the following series of outputs may be provided as an exemplary four bit thermometer code: '0000', '1000', '1100', '1110', '1111'. In the preceding example, the code '0000' may represent the lowest possible received analog value, and the code '1111' may represent the highest received analog value. The intervening codes represent the resolution between the high and low values. In the depicted circuit, comparator bank 112 includes sixty-three comparators capable of generating the corresponding sixty-four expected or ideal symbols.

In high-speed applications, some comparators within comparator bank 112 may generate a false response, showing some "bubbles" in the thermometer code pattern (known under this name because of the analogy with the bubbles appearing in a mercury thermometer). A thermometer code that does not exhibit bubbles is known as an ideal output pattern or expected code, while a thermometer code that exhibits a bubble is known as a non-ideal output pattern or unexpected code. As used herein, the phrase "ideal output pattern" is used in it broadest sense to mean any pattern that is expected, and the phrase "non-ideal output pattern" is used in its broadest sense to mean any unexpected output pattern. Thus, the previously provided four bit thermometer code was described by a progressively increasing series of ideal output patterns. Other non-ideal output patterns may, however, be generated by comparator bank where an error or other spurious behavior of analog to digital converter 110 occurs. These other non-ideal output patterns for the four bit example include: 0001, 0010, 0011, 0100, 0101, 0110, 0111, 1001, 1010, 1011, 1101. Each of these codes represent some error condition with some of the codes representing a more significant error condition than others. Encoder 114 may be designed to correct these non-ideal output patterns by mapping each non-ideal pattern onto the "closest" ideal pattern. However, the logic can not always reliably correct all errors, resulting in large noise at the ADC output. Thus, for example, non-ideal pattern 0101 could be mapped onto 1100 or 1111 or 0000. In this example, the uncertainty ranges across the entire exemplary four bit ADC range. In some embodiments of the present invention, such an error condition is avoided by setting an erasure pointer that causes the data corresponding to the non-ideal pattern to be rejected where too many errors are detected.

As mentioned output 113 is also provided to error look up table 120. Error look up table 120 converts the series of values received as output 113 to a series of pre-programmed error values provided as an output 121. In one particular case, an ideal or expected symbol corresponds to a zero output values, where non-ideal or unexpected symbols correspond to non-zero output value. The magnitude of the non-zero output values can be programmed to reflect the severity of the perceived error associated with a given non-ideal symbol. The errors programmed into look up table 120 reflect the probability that encoder 114 can properly correct one or more bubbles. Thus, where a code represents an easily corrected error, a smaller value will be programmed into look up table 120 than for a code where the probability of accurate correction is lower. Table 1 below shows exemplary look up table values corresponding to input values. Of note, the ideal input values correspond to non-zero error values and the non-ideal input values correspond to non-zero error values. It should be noted that the values of Table 1 are merely exemplary and that based on the disclosure provided herein, one of ordinary skill in the art will recognize other values that may be programmed into look up tables depending upon the perceived severity of an error represented by a code and an ability for other circuitry to correct the perceived error.

TABLE 1

Exemplary Corresponding Error Values for a Four Bit Thermometer Code

| Output of comparator bank | The "closest" legal pattern(s), which is output of the encoder | Uncertainty of encoder output, defined as the difference in the corresponding output values of all possible "closest" legal patterns | Minimum number of bubbles | Exemplary output of Error LUT |
|---|---|---|---|---|
| 0000 | 0000 | 0 | 0 | 0 |
| 0001 | 0000 | 0 | 1 | 1 |
| 0010 | 0000 | 0 | 1 | 1 |
| 0011 | 0000, 1111 | 4 | 2 | 4 |
| 0100 | 0000, 1100 | 2 | 1 | 2 |
| 0101 | 0000, 1100, 1111 | 4 | 2 | 4 |
| 0110 | 1110 | 0 | 1 | 1 |
| 0111 | 1111 | 0 | 1 | 1 |
| 1000 | 1000 | 0 | 0 | 0 |
| 1001 | 1000 | 0 | 1 | 1 |
| 1010 | 1000, 1110 | 2 | 1 | 2 |
| 1011 | 1111 | 0 | 1 | 1 |
| 1100 | 1100 | 0 | 0 | 0 |
| 1101 | 1111 | 0 | 1 | 1 |
| 1110 | 1110 | 0 | 0 | 0 |
| 1111 | 1111 | 0 | 0 | 0 |

Using error look up table 120, an error value for each output pattern of output 112 is provided. The corresponding error values from look up table 120 are provided to an accumulator 160 as output 121. Each error value is added to the existing error value stored in a register 164 using an adder 162. Thus, as errors are received, the value maintained in register 164 increases. In one particular implementation, accumulator 160 is implemented with a seven bit register 164, an adder 162, and seven AND-gates with inverting input 166 to clear the accumulated value. A cumulative error value 161 from register 164 is provided to a multiplexer 180.

In addition, erasure value generating circuit 100 includes a sync mark detector 140 and a symbol counter 150. In operation, sync mark detector 140 monitors an incoming data stream and identifies synchronization data within the data stream. In some cases, sync mark detector 140 is a sync mark detector circuit that is commonly used in hard disk drive applications to identify synchronization data within wedges distributed around the platter of a hard disk drive. However, sync mark detector 140 may be any circuit capable of detecting an indication of a location within a data stream. Data is often arranged in a series of segments of known size that begin some point after a synchronization mark. These segments may be generally referred to as symbols, and symbol counter 150 is responsible for identifying individual symbols within an incoming data stream. In the depicted case, symbol counter 150 is a modulo 10T counter that is tailored for identifying a series of symbols within the data stream, where a symbol spans ten periods.

Each time a new symbol is indicated (i.e., each ten periods of the incoming data stream), an output 151 (i.e., load output) is asserted high. Output 151 is applied to the selection input of a multiplexer 180 causing multiplexer 180 to pass output 161 to the input of register 190. Register 190 is then clocked causing output 161 to be stored in register 190. The output of register 190 is an error value 191. During processing of the next symbol, output 151 is asserted low causing the output of register 190 to be fed back into register 190 via multiplexer 180. In this way, the erasure value maintains its state for a symbol at a time.

In addition, when a new symbol is indicated through the assertion of output 151, a zero value is applied to adder 162 via a gate 166. In this way, the error value count is effectively reset after each symbol completes. This allows accumulator 160 to maintain an error count associated with data from each incoming symbol. As shown, all flip-flops or registers in erasure pointer generating circuit 100 are clocked by a signal "clk", whose period equals 1T.

Figure 4:
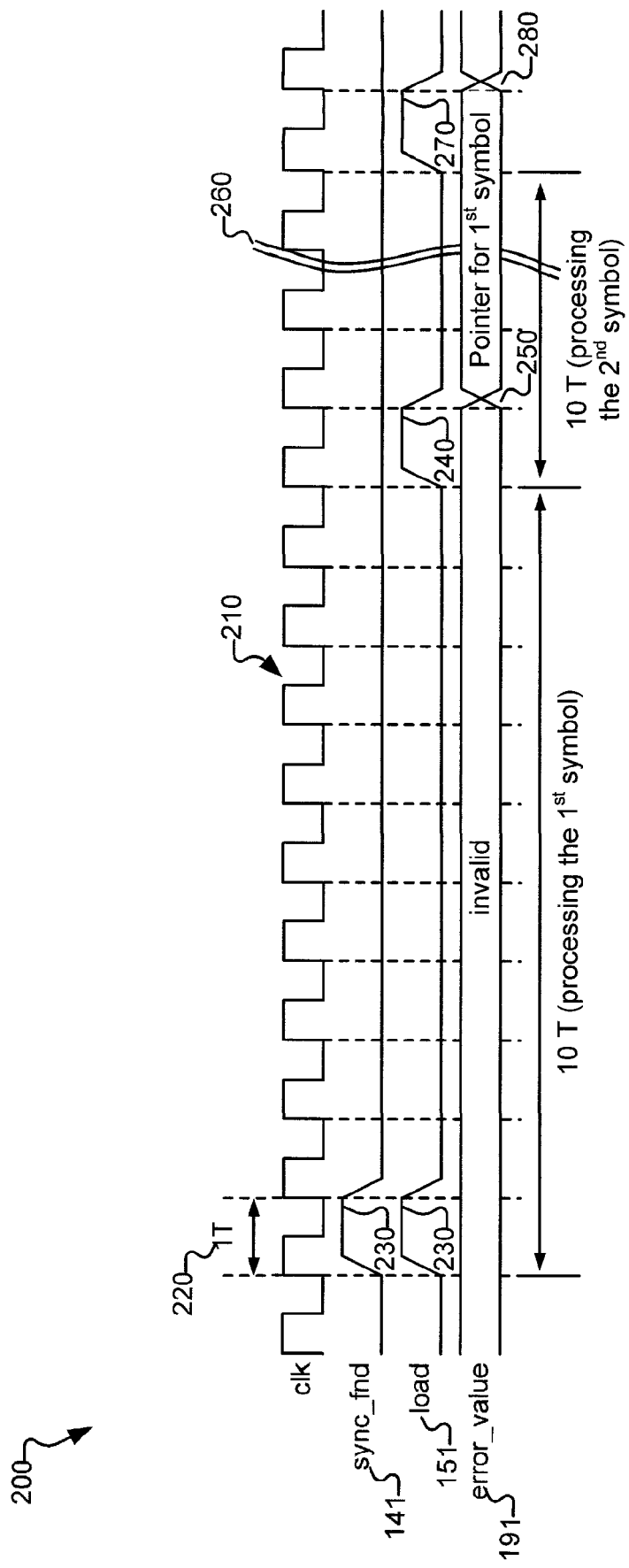
FIG. 4 is a timing diagram depicting an exemplary operation of the circuit in FIG. 3 in accordance with some embodiments of the present invention.

Turning to FIG. 4, a timing diagram 200 depicts an exemplary operation of the circuit in FIG. 3. The clk signal is shown as a series of pulses with a period (1T) 220. At some point 230 during the processing of the incoming data stream, a synchronization mark in the data stream is identified causing an output 141 (i.e., a sync found output) to assert high for one clock period. At the same time 230, output 151 asserts high for one clock period. This causes the accumulated error value to be stored to register 190, and for accumulator 160 to be reset. One symbol later in time 240, symbol counter 150 asserts output 151 high. This causes register 190 to update with the value from accumulator 160 which is shown as an update of error value 191 (point 250), and for accumulator 160 to reset. The process then repeats with output 151 being asserted high one symbol later (point 270). The time period between point 240 and point 270 is compressed as indicated by wavy lines 260. Upon assertion of output 151, register 190 is updated with the value from accumulator 160 which is shown as an update of error value 191 (point 280), and accumulator 160 is reset. This process continues until the next synchronization mark is identified at which time symbols are again counted from that synchronization mark. Error value 191 may be further delayed and aligned with the corresponding symbol-data that is transferred to a down stream error correction circuit (not shown in FIG. 3). The error correction circuit may use error value 191 to erase flagged symbols, which enables the error correction circuit to correct more symbols resulting in a better error rate performance of the hard disk drive system.

Figure 5:
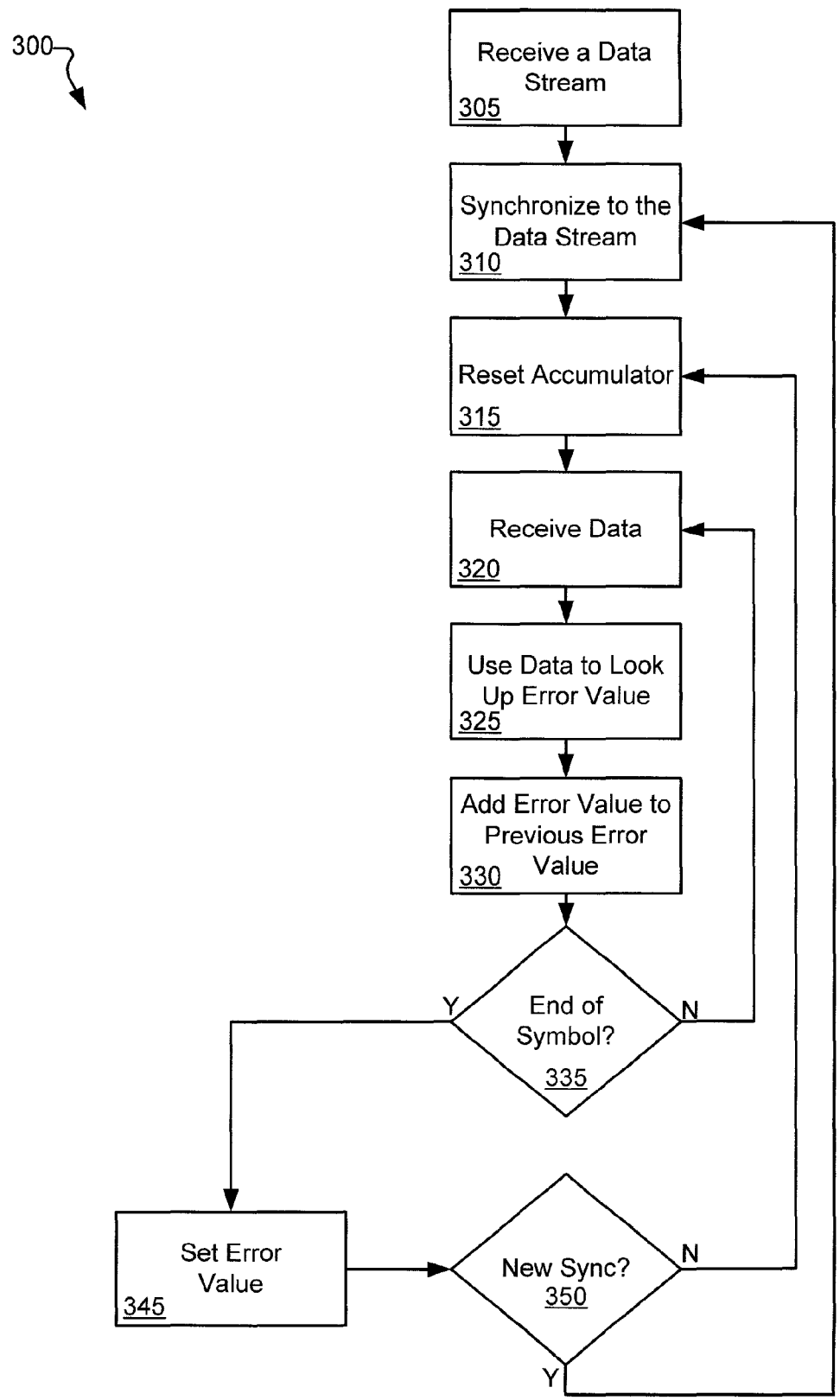
FIG. 5 is a flow diagram depicting a method for generating error pointers based on analog to digital conversion error detection in accordance with some embodiments of the present invention.

Turning to FIG. 5, a flow diagram 300 depicts a method for generating erasure values based on analog to digital conversion error detection in accordance with some embodiments of the present invention. Following flow diagram 300, a data stream is received as an analog signal and converted to a digital representation thereof (block 305). A synchronization mark is identified in the data stream and the process is synchronized using the synchronization mark (block 310), and the accumulator is reset (block 315). The digital data is received from the analog to digital converter (block 320) and the received data is used to access an error look up table (block 325). An error value corresponding to the received data is obtained from the error look up table, and the error value is added to a previously accumulated error value maintained in the accumulator (block 330). It is determined whether the end of a symbol has been reached (block 335). Where the end of a symbol has not yet been reached (block 335), the process continues by receiving and processing the next data (blocks 320-335).

Alternatively, where the end of the symbol has been achieved (block 335), the accumulated erasure value is stored to the output register (block 345). It is then determined whether another synchronization mark has been identified (block 350). Where another synchronization mark has been identified (block 350), the process is re-synchronized (block 310) and the processing continues for the next symbols (blocks 315-355). Otherwise, where another synchronization mark is not identified (block 350), the accumulator is reset (block 315) and the processing continues for the next symbol (blocks 320-355).

Figure 6:
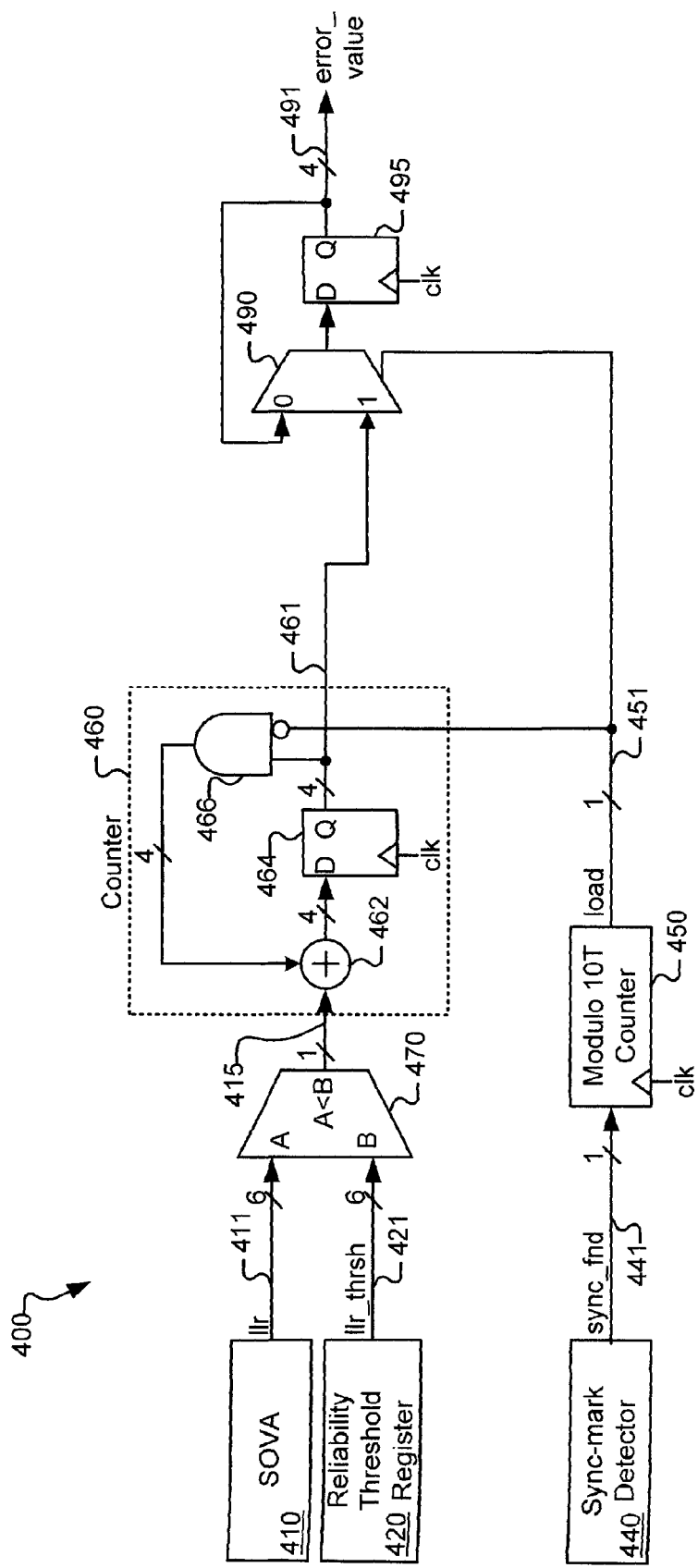
FIG. 6 is a schematic diagram of a circuit for generating error pointers based on soft inputs in accordance with one or more embodiments of the present invention.

Turning to FIG. 6, another exemplary erasure value generating circuit 400 based on soft inputs is depicted. Erasure value generating circuit 400 includes a soft output viterbi algorithm detector 410 that provides both bit decisions and associated reliability information (i.e., soft output) as is known in the art. The reliability information is provided as an output 411 to a comparator 470. In addition, comparator 470 receives a reliability threshold output 421 that represents a value programmed into a threshold register 420. An output 471 from comparator 470 is provided to a counter 460. It should be noted that counter 460 is a special type of an accumulator and that based on the disclosure provided herein, one of ordinary skill in the art will recognize other types of accumulators that may be used in accordance with one or more embodiments of the present invention. As shown, counter 460 includes a four bit register 464 that maintains the accumulated count value, an adder 462 and four AND-gates each with one inverted input 466. In operation, each time reliability output 411 is less than reliability threshold 421, comparator output 471 is asserted high and counter 460 is incremented. In contrast, each time reliability output 411 is greater than reliability threshold 421, comparator output 471 is asserted low and counter 460 is not incremented. Thus, an output value 461 of counter 460 provides a representation of the probability that a symbol has been properly construed.

Output value 461 (i.e., the accumulated error value) is provided to a multiplexer 490. In addition, erasure value generating circuit 400 includes a sync mark detector 440 and a symbol counter 450. In operation, sync mark detector 440 monitors an incoming data stream and identifies synchronization data within the data stream. In some cases, sync mark detector 440 is a sync mark detector circuit that is commonly used in hard disk drive applications to identified synchronization data within wedges distributed around the platter of a hard disk drive. However, sync mark detector 440 may be any circuit capable of detecting an indication of a location within a data stream. Data is often arranged in a series of segments of known size that begin some point after a synchronization mark. These segments may be generally referred to as symbols, and symbol counter 450 is responsible for identifying individual symbols within an incoming data stream. In the depicted case, symbol counter 450 is a modulo 10T counter that is tailored for identifying a series of symbols within the data stream, where a symbol spans ten periods.

Each time a new symbol is indicated (i.e., each ten periods of the incoming data stream), an output 451 (i.e., load output) is asserted high. Output 451 is applied to the selection input of a multiplexer 490 causing multiplexer 490 to pass output 481 to the input of register 495. Register 495 is then clocked causing output 461 to be stored in register 495. The output of register 495 is an error value 491. During processing of the next symbol, output 451 is asserted low causing the output of register 495 to be fed back into register 495 via multiplexer 490. In this way, the error value maintains its state for a symbol at a time.

In addition, when a new symbol is indicated through the assertion of output 451, a zero value is applied to adder 462 via AND gate 466. In this way, the error value count is effectively reset after each symbol completes. This allows counter 460 to maintain an error count associated with data from each incoming symbol. As shown, all flip-flops or registers in erasure value generating circuit 400 are clocked by a signal "clk", whose period equals 1T.

Figure 7:
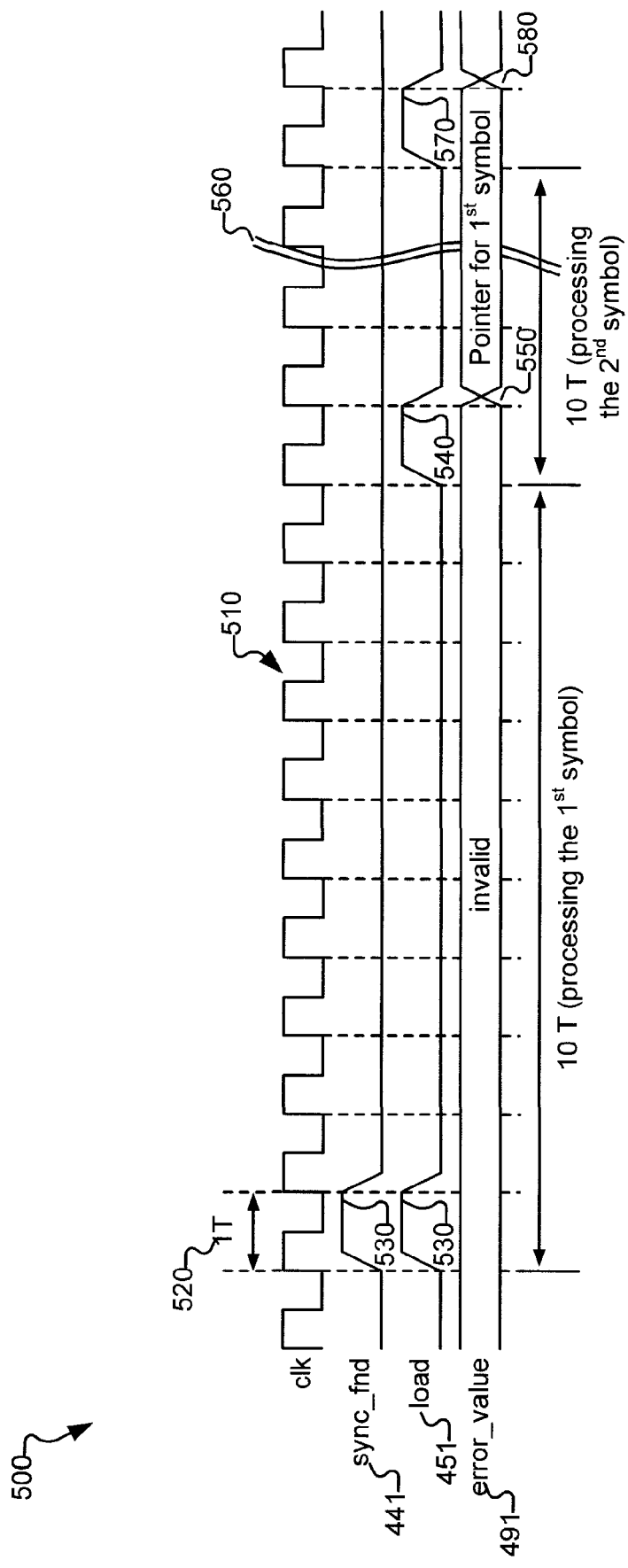
FIG. 7 is a timing diagram depicting an exemplary operation of the circuit in FIG. 6 in accordance with some embodiments of the present invention.

Turning to FIG. 7, a timing diagram 500 depicts an exemplary operation of the circuit in FIG. 6. The clk signal is shown as a series of pulses with a period (1T) 520. At some point 530 during the processing of the incoming data stream, a synchronization mark in the data stream is identified causing output 441 (i.e., a sync found output) to assert high for one clock period. At the same time 530, output 451 asserts high for one clock period. This causes the accumulated error value to be stored to register 495, and for counter 460 to be reset. One symbol later in time 540, symbol counter 550 asserts output 551 high. This causes register 495 to update with the value from counter 560 which is shown as an update of error value 491 (point 550), and for counter 560 to reset. The process then repeats with output 451 being asserted high one symbol later (point 570). The time period between point 540 and point 570 is compressed as indicated by wavy lines 560. Upon assertion of output 451, register 495 is updated with the value from counter 460 which is shown as an update of error value 491 (point 580), and counter 460 is reset. This process continues until the next synchronization mark is identified at which time symbols are again counted from that synchronization mark. Error value 491 may be further delayed and aligned with the corresponding symbol-data that is transferred to a down stream error correction circuit (not shown in FIG. 6). The error correction circuit may use error value 491 to erase flagged symbols, which enables the error correction circuit to correct more symbols resulting in a better error rate performance of the hard disk drive system.

Figure 8:
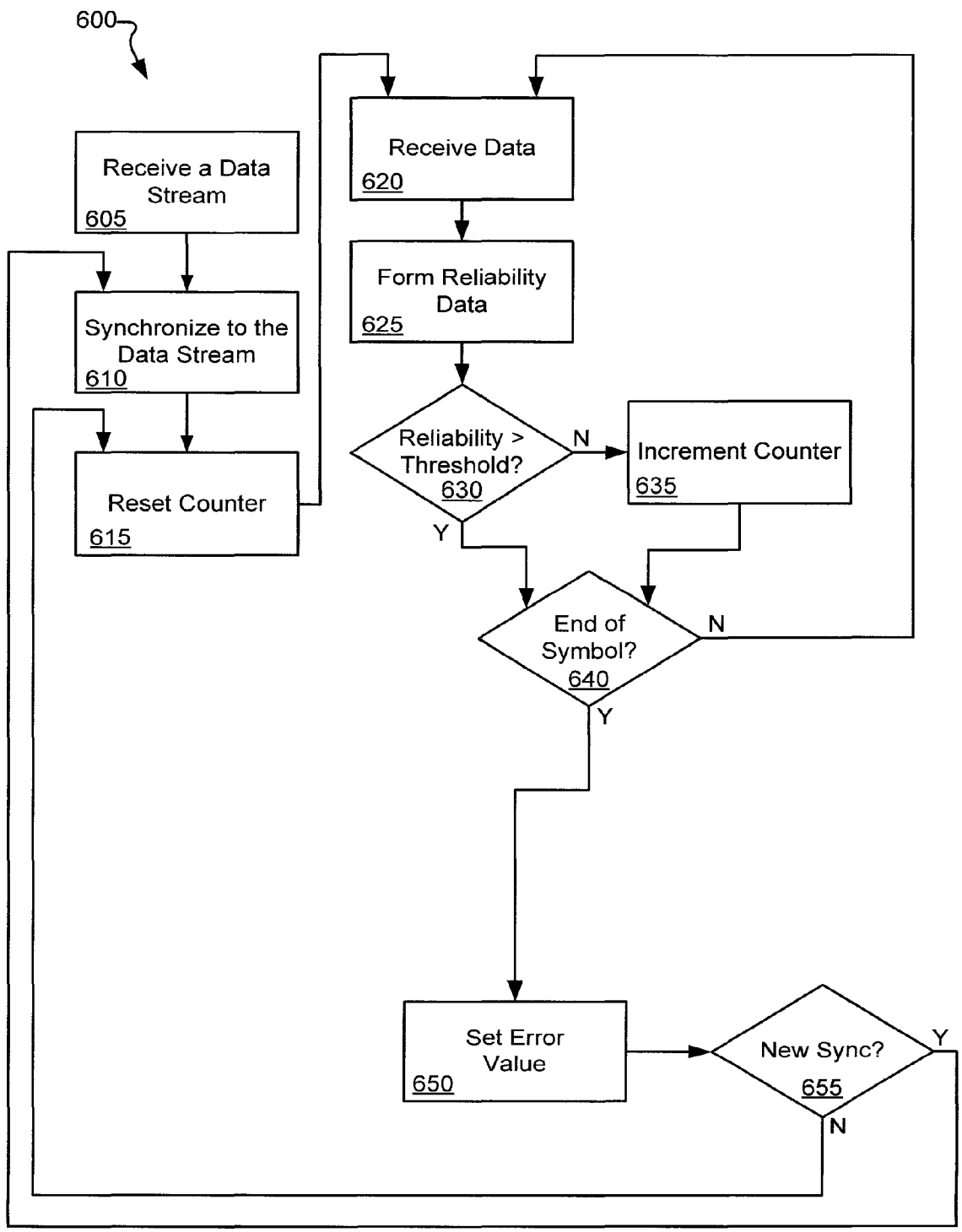
FIG. 8 is a flow diagram depicting a method for generating error pointers based on soft inputs in accordance with some embodiments of the present invention.

Turning to FIG. 8, a flow diagram 600 depicts a method for generating erasure pointers based on soft inputs in accordance with some embodiments of the present invention. Following flow diagram 600, a data stream is received (block 605). A synchronization mark is identified in the data stream and the process is synchronized using the synchronization mark (block 610), and a counter is reset (block 615). The data is received (block 620) at some point in the digital processing chain and reliability data associated with the data is produced (block 625). This reliability data is compared with a reliability threshold (block 630). Where the reliability data is less than the threshold (i.e., there is a substantial probability that the data is improperly construed) (block 630), then the counter is incremented (block 635). The counter indicates an error value, with the higher value on the counter indicating the greater probability of errors. Alternatively, where the reliability data is greater than the threshold (i.e., the data is most likely valid) (block 635), then the counter is not incremented.

It is determined whether the end of a symbol has been reached (block 640). Where the end of a symbol has not yet been reached (block 640), the process continues by receiving and processing the next data (blocks 620-640). Alternatively, where the end of the symbol has been achieved (block 640), the accumulated erasure value is stored to the output register (block 650). It is then determined whether another synchronization mark has been identified (block 655). Where another synchronization mark has been identified (block 655), the process is re-synchronized (block 610) and the processing continues for the next symbols (blocks 615-660). Otherwise, where another synchronization mark is not identified (block 655), the counter is reset (block 615) and the processing continues for the next symbol (blocks 620-660).

In conclusion, the present invention provides novel systems, devices, methods and arrangements for generating and/or ordering erasure pointers. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for ordering error indications, the system comprising:
    a group of N sort cells; wherein N is a whole number; wherein each of the N sort cells is operable to maintain a respective error value and associated error pointer; and wherein the group of N sort cells is operable to receive an incoming error value and associated error pointer, and to update the error value and associated error pointer of one or more of the group of N sort cells based in part on the incoming error value; and
    a selector circuit, wherein the selector circuit is operable to allow selectable access to each of the respective error pointers maintained in the group of N sort cells.

2. The system of claim 1, wherein the selector circuit is a multiplexer.

3. The system of claim 1, wherein the system is implemented as part of a storage device.

4. The system of claim 3, wherein the storage device is a hard disk drive.

5. The system of claim 3, wherein the storage device includes:
    a storage medium operable to maintain information; and
    a read channel circuit operable to receive the information from the storage medium, wherein the system is implemented as part of the read channel circuit.

6. The system of claim 1, wherein each of the N sort cells includes a comparator, and wherein the comparator is operable to compare the incoming error value with the error value held in the respective sort cell.

7. The system of claim 2, wherein each of the N sort cells includes an update circuit, and wherein the update circuit is operable update the respective sort cell to include the incoming error value and associated error pointer when the comparison of the incoming error value with the error value held in the respective sort cell indicates that the incoming error value is more significant than the error value held in the respective sort cell.

8. The system of claim 7, wherein the error value held in the $N^{th}$ sort cell is less than the error value held in the $(N-1)^{th}$ sort cell, and wherein the error value held in the first sort cell is greater than the error value held in the $(N-1)^{th}$ sort cell.

9. The system of claim 8, wherein the group of N sort cells is operable to disregard the incoming error value and associated error pointer when the incoming error value is less than the error value maintained in the $N^{th}$ sort cell.

10. A method for ordering erasure pointers, the method comprising:
    receiving a plurality of error indications, wherein each of the plurality of error indications includes an error value and an error pointer;
    ordering the plurality of error indications based on the respective error values;
    maintaining the plurality of error indications in a register set; and
    providing a selector circuit, wherein the selector circuit is operable to provide respective error pointers from the register set based on the ordering of the plurality of error indications.

11. The method of claim 10, wherein the method further comprises:
    receiving an additional error indication, wherein the additional error indication includes an error value and an error pointer;
    comparing the error value associated with the additional error indication with the error values associated with one or more of the plurality of error indications, wherein the error value associated with the additional error indication is more significant than at least one of the one or more of the plurality of error indications; and
    re-ordering the plurality of error indications based on the comparison.

12. The method of claim 10, wherein the method further comprises:
    receiving an additional error indication, wherein the additional error indication includes an error value and an error pointer;
    comparing the error value associated with the additional error indication with the least significant error value included in the plurality of error indications, wherein the error value associated with the additional error indication is less significant than the least significant error value included in the plurality of error indications; and
    disregarding the additional error indication.

13. A system for generating and ordering error indications, the system comprising:
    an error indication generator, wherein the error indication generator is operable to provide at least a first error value and an associated first error pointer, and a second error value and an associated second error pointer; and
    an error prioritizing circuit, wherein the error prioritizing circuit is operable to:
        receive the first error value and an associated first error pointer, and the second error value and the associated second error pointer;
        compare the first error value with the second error value, wherein the first error value indicates an error of greater significance than the second error value; and
        maintain a prioritized list of the first error pointer and the second error pointer, wherein the prioritized list indicates that the first error pointer is associated with an error of greater significance than that of the second error pointer.

14. The system of claim 13, wherein the error indication generator is selected from a group consisting of: a circuit that detects thermal asperities, a sequence detector, and an ADC error detector.

15. The system of claim 13, wherein the error indication generator is the ADC error detector, and wherein the ADC error detector comprises:
    an analog to digital converter, wherein the analog to digital converter is operable to receive an analog signal and to produce a series of digital values based on the analog signal; and
    an error look up table, wherein the error look up table is operable to receive the series of digital values and to produce a corresponding series of error values.

16. The system of claim 13, wherein the error indication generator is a sequence detector, and wherein the sequence detector comprises:
    a soft output viterbi detector, wherein the soft output viterbi detector is operable to receive a data stream and to produce a series of reliability indicators based on the data stream; and wherein the soft output viterbi detector provides a bit decision in relation to each of the respective reliability indicators;
    a reliability threshold register, wherein the reliability threshold register provides a reliability threshold output;
    a comparator, wherein the comparator compares the reliability threshold output with each of the respective reliability indicators, and wherein the comparator provides a non-zero value each time one of the reliability indicators exceeds the reliability threshold output; and
    an accumulator, wherein the accumulator sums the non-zero values.

17. The system of claim 16, wherein the comparator is a first comparator, wherein the accumulator provides an accumulator error output, and wherein the system further comprises:
    an error threshold register, wherein the error threshold register provides an error threshold output;
    a second comparator, wherein the second comparator compares the error threshold output with the accumulator error output, and wherein the second comparator indicates an error condition when the accumulator error output is greater than the error threshold output; and
    a latch, wherein the latch stores the indication of the error condition.

18. The system of claim 13, wherein the system is implemented as part of a storage device.

19. The system of claim 18, wherein the storage device is a hard disk drive.

20. The system of claim 18, wherein the storage device includes:
    a storage medium operable to maintain information; and
    a read channel circuit operable to receive the information from the storage medium, wherein the read channel circuit incorporates the system.

21. The system of claim 13, wherein error prioritizing circuit includes:
    a group of N sort cells; wherein N is a whole number; wherein each of the N sort cells is operable to maintain a respective error value and associated error pointer; and wherein the group of N sort cells is operable to receive an incoming error value and associated error pointer, and to update the error value and associated error pointer of one or more of the group of N sort cells based in part on the incoming error value; and a selector circuit, wherein the selector circuit is operable to allow selectable access to each of the respective error pointers maintained in the group of N sort cells.

22. The system of claim 21, wherein the selector circuit is a multiplexer.

23. The system of claim 21, wherein each of the N sort cells includes a comparator, and wherein the comparator is operable to compare the incoming error value with the error value held in the respective sort cell.

24. The system of claim 23, wherein each of the N sort cells includes an update circuit, and wherein the update circuit is operable update the respective sort cell to include the incoming error value and associated error pointer when the comparison of the incoming error value with the error value held in the respective sort cell indicates that the incoming error value is more significant than the error value held in the respective sort cell.

25. The system of claim 24, wherein the error value held in the $N^{th}$ sort cell is less than the error value held in the $(N-1)^{th}$ sort cell, and wherein the value held in the first sort cell is greater than the value held in the $(N-1)^{th}$ sort cell.

26. The system of claim 25, wherein the group of N sort cells is operable to disregard the incoming error value and associated error pointer when the incoming error value is less than the error value maintained in the $N^{th}$ sort cell.

27. A circuit for ordering error indications, the circuit comprising:

a group of N sort cells, wherein each of the N sort cells maintains a respective error value and associated error pointer, wherein the group of N sort cells receives an incoming error value and associated error pointer and updates the error value and associated error pointer of one or more of the group of N sort cells based in part on the incoming error value, and wherein N is a whole number; and a selector circuit that controls selectable access to each of the respective error pointers maintained in the group of N sort cells.

28. The circuit of claim 27, wherein each of the N sort cells includes a comparator, and wherein the comparator compares the incoming error value with the error value held in the respective sort cell.

29. The circuit of claim 28, wherein each of the N sort cells includes an update circuit, and wherein the update circuit updates the respective sort cell to include the incoming error value and associated error pointer when the comparison of the incoming error value with the error value held in the respective sort cell indicates that the incoming error value is more significant than the error value held in the respective sort cell.

30. The circuit of claim 27, wherein the circuit is implemented as part of a storage device.

31. The circuit of claim 30, wherein the storage device is a hard disk drive.

32. The circuit of claim 30, wherein the storage device includes:

a storage medium operable to maintain information; and a read channel circuit operable to receive the information from the storage medium, wherein the system is implemented as part of the read channel circuit.

33. A read channel circuit, the read channel circuit comprising:

an error indication generator, wherein the error indication generator provides at least a first error value and an associated first error pointer, and a second error value and an associated second error pointer; and an error prioritizing circuit, wherein the error prioritizing circuit:

receives the first error value and an associated first error pointer, and the second error value and the associated second error pointer, compares the first error value with the second error value, wherein the first error value indicates an error of greater significance than the second error value; and maintains a prioritized list of the first error pointer and the second error pointer, wherein the prioritized list indicates that the first error pointer is associated with an error of greater significance than that of the second error pointer.

* * * * *